US011101108B2

(12) United States Patent
Slobodov et al.

(10) Patent No.: US 11,101,108 B2
(45) Date of Patent: Aug. 24, 2021

(54) NANOSECOND PULSER ADC SYSTEM

(71) Applicant: Eagle Harbor Technologies, Inc., Seattle, WA (US)

(72) Inventors: Ilia Slobodov, Seattle, WA (US); John Carscadden, Seattle, WA (US); Kenneth Miller, Seattle, WA (US); Timothy Ziemba, Bainbridge Island, WA (US); Huatsern Yeager, Olympia, WA (US); Eric Hanson, Kingston, WA (US); TaiSheng Yeager, Seattle, WA (US); Kevin Muggli, Mountlake Terrace, WA (US)

(73) Assignee: EAGLE HARBOR TECHNOLOGIES INC., Seattle, WA (US)

( * ) Notice: Subject to any disclaimer, the term of this patent is extended or adjusted under 35 U.S.C. 154(b) by 0 days.

(21) Appl. No.: 16/848,830

(22) Filed: Apr. 14, 2020

(65) Prior Publication Data
US 2020/0244254 A1 Jul. 30, 2020

Related U.S. Application Data

(63) Continuation of application No. 16/525,357, filed on Jul. 29, 2019, now Pat. No. 10,659,019, which is a (Continued)

(51) Int. Cl.
*H01J 37/32* (2006.01)
*H01L 21/683* (2006.01)
(Continued)

(52) U.S. Cl.
CPC .. *H01J 37/32146* (2013.01); *H01J 37/32082* (2013.01); *H01J 37/32091* (2013.01);
(Continued)

(58) Field of Classification Search
CPC ...... H01S 3/2215; H01S 3/036; H01S 3/0385; H01S 3/041; H01S 3/097; H01S 3/09702;
(Continued)

(56) References Cited

U.S. PATENT DOCUMENTS 3,339,108 A 8/1967 Holtje
4,070,589 A 1/1978 Martinkovic
(Continued)

FOREIGN PATENT DOCUMENTS

CA 2292526 A1 12/1999
EP 174164 A2 3/1986
(Continued)

OTHER PUBLICATIONS

International Search Report and Written Opinion as issued in connection with International Patent Application No. PCT/US20/16253.
(Continued)

*Primary Examiner* — Monica C King
(74) *Attorney, Agent, or Firm* — Sanders IP Law

(57) ABSTRACT

A nanosecond pulser system is disclosed. In some embodiments, the nanosecond pulser system may include a nanosecond pulser having a nanosecond pulser input; a plurality of switches coupled with the nanosecond pulser input; one or more transformers coupled with the plurality of switches; and an output coupled with the one or more transformers and providing a high voltage waveform with a amplitude greater than 2 kV and a frequency greater than 1 kHz based on the nanosecond pulser input. The nanosecond pulser system may also include a control module coupled with the nanosecond pulser input; and an control system coupled with the nanosecond pulser at a point between the transformer and the output, the control system providing waveform data
(Continued)

regarding an high voltage waveform produced at the point between the transformer and the output.

23 Claims, 6 Drawing Sheets

Related U.S. Application Data continuation of application No. 16/523,840, filed on Jul. 26, 2019, now Pat. No. 10,892,140.

(60) Provisional application No. 62/711,406, filed on Jul. 27, 2018, provisional application No. 62/711,464, filed on Jul. 27, 2018, provisional application No. 62/711,334, filed on Jul. 27, 2018, provisional application No. 62/711,457, filed on Jul. 27, 2018, provisional application No. 62/711,347, filed on Jul. 27, 2018, provisional application No. 62/711,467, filed on Jul. 27, 2018, provisional application No. 62/711,468, filed on Jul. 27, 2018, provisional application No. 62/717,523, filed on Aug. 10, 2018, provisional application No. 62/789,523, filed on Jan. 8, 2019, provisional application No. 62/789,526, filed on Jan. 8, 2019.

(51) Int. Cl.
| | | |
|---|---|---|
| H01L 21/687 | (2006.01) | |
| H02M 3/335 | (2006.01) | |
| H03K 3/57 | (2006.01) | |
| H05K 7/20 | (2006.01) | |
| H03M 1/12 | (2006.01) | |

(52) U.S. Cl.
CPC .. *H01J 37/32128* (2013.01); *H01J 37/32174* (2013.01); *H01J 37/32541* (2013.01); *H01J 37/32568* (2013.01); *H01J 37/32715* (2013.01); *H01L 21/6833* (2013.01); *H01L 21/68757* (2013.01); *H02M 3/33523* (2013.01); *H03K 3/57* (2013.01); *H03M 1/12* (2013.01); *H05K 7/20154* (2013.01); *H05K 7/20172* (2013.01); *H05K 7/20254* (2013.01); *H05K 7/20272* (2013.01); *H05K 7/20281* (2013.01); *H05K 7/20509* (2013.01)

(58) Field of Classification Search
CPC ............... H01S 3/09707; H01S 3/0977; H01S 3/09775; H01S 3/223; H01S 3/2232; A61N 1/0408; A61N 1/0412; A61N 1/0452; A61N 1/0456; A61N 1/327; A61N 1/16; A61N 2/002; A61N 2/06; H03K 3/537; H03K 3/57; H03K 5/159
See application file for complete search history.

(56) References Cited

U.S. PATENT DOCUMENTS

| | | |
|---|---|---|
| 4,076,996 A | 2/1978 | Naoyoshi |
| 4,438,331 A | 3/1984 | Davis |
| 4,504,895 A | 3/1985 | Steigerwald |
| 4,885,074 A | 12/1989 | Susko et al. |
| 4,924,191 A | 5/1990 | Erb et al. |
| 4,992,919 A | 2/1991 | Lee et al. |
| 5,140,510 A | 8/1992 | Myers |
| 5,313,481 A | 5/1994 | Cook et al. |
| 5,321,597 A | 6/1994 | Ziemba et al. |
| 5,325,021 A | 6/1994 | Duckworth et al. |
| 5,392,043 A | 2/1995 | Ribner |
| 5,451,846 A | 9/1995 | Peterson et al. |
| 5,488,552 A | 1/1996 | Sakamoto et al. |
| 5,610,452 A | 3/1997 | Shimer et al. |
| 5,623,171 A | 4/1997 | Nakajima |
| 5,656,123 A | 8/1997 | Salimian et al. |
| 5,729,562 A | 3/1998 | Birx et al. |
| 5,796,598 A | 8/1998 | Nowak et al. |
| 5,808,504 A | 9/1998 | Chikai et al. |
| 5,905,646 A | 5/1999 | Crewson et al. |
| 5,930,125 A | 7/1999 | Hitchcock et al. |
| 5,933,335 A | 8/1999 | Hitchcock et al. |
| 5,968,377 A | 10/1999 | Yuasa et al. |
| 6,059,935 A | 5/2000 | Spence |
| 6,066,901 A | 5/2000 | Burkhart et al. |
| 6,087,871 A | 7/2000 | Kardo-Syssoev et al. |
| 6,205,074 B1 | 3/2001 | Buskirk et al. |
| 6,222,321 B1 | 4/2001 | Scholl et al. |
| 6,238,387 B1 | 5/2001 | Miller, III |
| 6,253,704 B1 | 7/2001 | Savas |
| 6,359,542 B1 | 3/2002 | Widmayer et al. |
| 6,362,604 B1 | 3/2002 | Cravey |
| 6,392,187 B1 | 5/2002 | Johnson |
| 6,483,731 B1 | 11/2002 | Isurin et al. |
| 6,496,047 B1 | 12/2002 | Iskander et al. |
| 6,518,195 B1 | 2/2003 | Collins et al. |
| 6,577,135 B1 | 6/2003 | Matthews et al. |
| 6,741,120 B1 | 5/2004 | Tan |
| 6,741,484 B2 | 5/2004 | Crewson et al. |
| 6,831,377 B2 | 12/2004 | Yampolsky |
| 6,897,574 B2 | 5/2005 | Vaysse |
| 6,947,300 B2 | 9/2005 | Pai et al. |
| 7,061,230 B2 | 6/2006 | Kleine |
| 7,180,082 B1 | 2/2007 | Hassanein |
| 7,291,545 B2 | 11/2007 | Collins et al. |
| 7,307,375 B2 | 12/2007 | Smith et al. |
| 7,319,579 B2 | 1/2008 | Inoue et al. |
| 7,354,501 B2 | 4/2008 | Gondhalekar et al. |
| 7,393,765 B2 | 7/2008 | Hanawa et al. |
| 7,396,746 B2 | 7/2008 | Walther et al. |
| 7,492,138 B2 | 2/2009 | Zhanh et al. |
| 7,512,433 B2 | 3/2009 | Bernhart et al. |
| 7,521,370 B2 | 4/2009 | Hoffman |
| 7,601,619 B2 | 10/2009 | Okumura et al. |
| 7,605,385 B2 | 10/2009 | Bauer |
| 7,767,433 B2 | 8/2010 | Kuthi et al. |
| 7,901,930 B2 | 3/2011 | Kuthi et al. |
| 7,936,544 B2 | 5/2011 | Beland |
| 7,948,185 B2 | 5/2011 | Smith et al. |
| 8,093,797 B2 | 1/2012 | Wilson |
| 8,093,979 B2 | 1/2012 | Wilson |
| 8,115,343 B2 | 2/2012 | Sanders et al. |
| 8,129,653 B2 | 3/2012 | Kirchmeier et al. |
| 8,143,790 B2 | 3/2012 | Smith et al. |
| 8,222,936 B2 | 7/2012 | Freidman et al. |
| 8,259,476 B2 | 9/2012 | Ben-Yaakov et al. |
| 8,436,602 B2 | 5/2013 | Sykes |
| 8,450,985 B2 | 5/2013 | Gray et al. |
| 8,575,843 B2 | 11/2013 | Moore et al. |
| 8,723,591 B2 | 5/2014 | Lee |
| 8,773,184 B1 | 7/2014 | Petrov |
| 8,847,433 B2 | 9/2014 | Vandermey |
| 8,963,377 B2 | 2/2015 | Ziemba et al. |
| 9,067,788 B1 | 6/2015 | Spielman et al. |
| 9,070,396 B1 | 6/2015 | Katchmart et al. |
| 9,122,350 B2 | 9/2015 | Kao et al. |
| 9,122,360 B2 | 9/2015 | Xu et al. |
| 9,287,086 B2 | 3/2016 | Brouk et al. |
| 9,287,092 B2 | 3/2016 | Brouk et al. |
| 9,306,533 B2 | 4/2016 | Mavretic |
| 9,329,256 B2 | 5/2016 | Murad |
| 9,417,739 B2 | 8/2016 | Cordeiro et al. |
| 9,435,029 B2 | 9/2016 | Brouk et al. |
| 9,493,765 B2 | 11/2016 | Krishnaswamy et al. |
| 9,601,283 B2 | 3/2017 | Ziemba et al. |
| 9,706,630 B2 | 7/2017 | Miller et al. |
| 9,767,988 B2 | 9/2017 | Brouk et al. |
| 9,960,763 B2 | 5/2018 | Miller et al. |
| 9,966,231 B2 | 5/2018 | Boswell et al. |
| 10,009,024 B2 | 6/2018 | Gan et al. |
| 10,020,800 B2 | 7/2018 | Prager et al. |
| 10,027,314 B2 | 7/2018 | Prager et al. |

(56) References Cited

U.S. PATENT DOCUMENTS

| | | | |
|---|---|---|---|
| 10,224,822 B2 | 3/2019 | Miller et al. | |
| 10,301,587 B2 | 5/2019 | Krishnaswamy et al. | |
| 10,304,661 B2 | 5/2019 | Ziemba et al. | |
| 10,373,804 B2 | 8/2019 | Koh et al. | |
| 10,382,022 B2 | 8/2019 | Prager et al. | |
| 10,460,910 B2 | 10/2019 | Ziemba et al. | |
| 10,460,911 B2 | 10/2019 | Ziemba et al. | |
| 10,483,089 B2 | 11/2019 | Ziemba et al. | |
| 10,555,412 B2 | 2/2020 | Dorf et al. | |
| 10,607,814 B2 | 3/2020 | Ziemba et al. | |
| 10,659,019 B2 | 5/2020 | Slobodov et al. | |
| 2001/0008552 A1 | 7/2001 | Harada | |
| 2002/0186577 A1 | 12/2002 | Kirbie | |
| 2003/0021125 A1 | 1/2003 | Rufer et al. | |
| 2003/0054647 A1 | 3/2003 | Suemasa et al. | |
| 2003/0071035 A1 | 4/2003 | Brailove | |
| 2003/0137791 A1 | 7/2003 | Arnet et al. | |
| 2003/0169107 A1 | 9/2003 | Lechevalier | |
| 2004/0085784 A1 | 5/2004 | Salama et al. | |
| 2004/0149217 A1 | 8/2004 | Collins et al. | |
| 2004/0263412 A1 | 12/2004 | Pribyl | |
| 2005/0152159 A1 | 7/2005 | Isurin et al. | |
| 2005/0270096 A1 | 12/2005 | Coleman | |
| 2006/0192774 A1 | 8/2006 | Yasumura | |
| 2006/0210020 A1 | 9/2006 | Takahashi | |
| 2006/0274887 A1 | 12/2006 | Sakamoto | |
| 2007/0018504 A1 | 1/2007 | Weiner et al. | |
| 2007/0114981 A1 | 5/2007 | Vasquez et al. | |
| 2007/0115705 A1 | 5/2007 | Gotzenberger | |
| 2007/0212811 A1 | 9/2007 | Hanawa et al. | |
| 2008/0062733 A1 | 3/2008 | Gay | |
| 2008/0106151 A1 | 5/2008 | Ryoo | |
| 2008/0143260 A1 | 6/2008 | Tuymer | |
| 2008/0198634 A1 | 8/2008 | Scheel | |
| 2008/0231337 A1* | 9/2008 | Krishnaswamy | C12N 13/00 327/291 |
| 2008/0252225 A1 | 10/2008 | Kurachi et al. | |
| 2008/0272706 A1 | 11/2008 | Kwon et al. | |
| 2009/0016549 A1 | 1/2009 | French et al. | |
| 2010/0007358 A1 | 1/2010 | Schaerrer | |
| 2010/0148847 A1 | 6/2010 | Schurack et al. | |
| 2010/0284208 A1 | 11/2010 | Nguyen | |
| 2011/0001438 A1 | 1/2011 | Chemel et al. | |
| 2011/0140607 A1 | 6/2011 | Moore et al. | |
| 2011/0309748 A1 | 12/2011 | Xia | |
| 2012/0016282 A1 | 1/2012 | Van Brunt et al. | |
| 2012/0081350 A1 | 4/2012 | Sano et al. | |
| 2012/0155613 A1 | 6/2012 | Caiafa | |
| 2013/0024784 A1 | 1/2013 | Lifton | |
| 2013/0027848 A1 | 1/2013 | Said | |
| 2013/0075390 A1 | 3/2013 | Ashida | |
| 2013/0092529 A1 | 4/2013 | Singh et al. | |
| 2013/0113650 A1 | 5/2013 | Behbahani et al. | |
| 2013/0174105 A1 | 7/2013 | Nishio et al. | |
| 2013/0175575 A1 | 7/2013 | Ziemba et al. | |
| 2014/0009969 A1 | 1/2014 | Yuzurihara | |
| 2014/0021180 A1 | 1/2014 | Vogel | |
| 2014/0077611 A1 | 3/2014 | Young et al. | |
| 2014/0109886 A1 | 4/2014 | Singleton et al. | |
| 2014/0118414 A1 | 5/2014 | Seo et al. | |
| 2014/0146571 A1 | 5/2014 | Ryoo | |
| 2014/0268968 A1 | 9/2014 | Richardson | |
| 2014/0354343 A1 | 12/2014 | Ziemba et al. | |
| 2015/0028932 A1 | 1/2015 | Ziemba et al. | |
| 2015/0076372 A1 | 3/2015 | Ziemba et al. | |
| 2015/0084509 A1 | 3/2015 | Yuzurihara et al. | |
| 2015/0130525 A1 | 5/2015 | Miller et al. | |
| 2015/0256086 A1 | 9/2015 | Miller et al. | |
| 2015/0303914 A1 | 10/2015 | Ziemba et al. | |
| 2015/0311680 A1 | 10/2015 | Burrows et al. | |
| 2015/0318846 A1 | 11/2015 | Prager et al. | |
| 2016/0020070 A1 | 1/2016 | Kim et al. | |
| 2016/0020072 A1 | 1/2016 | Brouk et al. | |
| 2016/0182001 A1 | 6/2016 | Hua | |
| 2016/0241234 A1 | 8/2016 | Mavretic | |
| 2016/0327029 A1 | 11/2016 | Ziemba et al. | |
| 2016/0327089 A1 | 11/2016 | Adam et al. | |
| 2017/0243731 A1 | 8/2017 | Ziemba et al. | |
| 2017/0294842 A1 | 10/2017 | Miller et al. | |
| 2017/0311431 A1 | 10/2017 | Park | |
| 2017/0359886 A1* | 12/2017 | Binderbauer | G21B 1/052 |
| 2017/0366173 A1 | 12/2017 | Miller et al. | |
| 2018/0226896 A1 | 8/2018 | Miller et al. | |
| 2018/0286636 A1 | 10/2018 | Ziemba et al. | |
| 2018/0315583 A1 | 11/2018 | Luere et al. | |
| 2018/0374689 A1 | 12/2018 | Abraham et al. | |
| 2019/0080884 A1 | 3/2019 | Ziemba et al. | |
| 2019/0131110 A1 | 5/2019 | Ziemba et al. | |
| 2019/0157044 A1 | 5/2019 | Ziemba et al. | |
| 2019/0157980 A1 | 5/2019 | Chao | |
| 2019/0172685 A1 | 6/2019 | Van Zyl et al. | |
| 2019/0180982 A1 | 6/2019 | Brouk et al. | |
| 2019/0228952 A1 | 7/2019 | Dorf | |
| 2019/0326092 A1 | 10/2019 | Ogasawara | |
| 2019/0348258 A1 | 11/2019 | Koh et al. | |
| 2019/0393791 A1 | 12/2019 | Ziemba et al. | |
| 2020/0035457 A1 | 1/2020 | Ziemba et al. | |
| 2020/0035458 A1 | 1/2020 | Ziemba et al. | |

FOREIGN PATENT DOCUMENTS

| | | |
|---|---|---|
| EP | 0947048 A1 | 10/1999 |
| EP | 1128557 A2 | 8/2001 |
| EP | 1515430 | 3/2005 |
| FR | 2771563 A1 | 5/1999 |
| WO | 9738479 A1 | 10/1997 |
| WO | 0193419 A1 | 12/2001 |
| WO | 2018186901 A1 | 10/2018 |

OTHER PUBLICATIONS

Quinley. M, et al., "High Voltage Nanosecond Pulser Operating at 30 kW and 400 kHz" APS-GEC-2018. Published Nov. 2018. Retrieved Jan. 24, 2020 <URL: https://www.eagleharbortech.com/wp-content/uploads/2018/11/APS-GEC-2018-NSP-web.pdf> p. 1.

International Search Report and Written Opinion, as issued in connection with International Patent Application No. PCT/US2019/013988, dated Dec. 10, 2019, 5 pages.

International Search Report and Written Opinion, as issued in connection with International Patent Application No. PCT/US2018/016993, dated Apr. 18, 2018, 10 pages.

International Search Report and Written Opinion, as issued in connection with International Patent Application No. PCT/US2019/25440 dated Jun. 25, 2018, 25 pages.

Bland, M., et al., "A High Power RF Power Supply for High Energy Physics Applcations," Proceedings of the Particle Accelerator Conference, Knoxville, TN, May 16-20, 2005, pp. 4018-4020.

In, Y., et al., "On the roles of direct feedback and error field correction in stabilizing resistive-wall modes," Nuclear Fusion, 2010, retrieved from p:///stacks.iop.org/NF/50/042001 on Apr. 12, 2012, vol. 50, No. 4, 5 pages.

Kim, J., et al., "High Voltage Pulsed Power Supply Using IGBT Stacks," IEEE Transactions on Dielectrics and Electrical Insulation, Aug. 2007, vol. 14, No. 4, 921-926.

Ocher, R., "Introduction to Power MOSFETs and their Applications {Application Note 558)," Fairchild Semiconductor, Oct. 1998, 15 pages.

Ocher, R., et al., "Use of BiMOSFETs in Modem Radar Transmitters," IEEE International Conference on Power Electronics and Drive Systems, Indonesia, 2001, pp. 776-782.

Reass, W., et al., "Progress Towards a 20 KV, 2 KA Plasma Source Ion Implantation Modulator for Automotive Production of Diamond Film on Aluminum," Submitted to 22nd International Power Symposium, Boca Raton, FL, Jun. 24-27, 1996, 6 pages.

Scoville, J., et al., "The Resistive Wall Mode Feedback Control System on DIII-D," IEEE/NPSS 18th Symposium on rusion Engineering, Albuquerque, NM, Oct. 25-29, 1999, General Atomics Report GAA23256, Nov. 1999, 7 pages.

(56) References Cited

OTHER PUBLICATIONS

Zavadtsev, D., et al., "Compact Electron Linear Accelerator RELUS-5 for Radiation Technology Application," 1oth European Particle Accelerator Conference, Edinburgh, UK, Jun. 26-30, 2006, 3 pages.
International Search Report and Written Opinion dated Sep. 15, 2014 as received in PCT Application No. PCT/US2014/04029.
International Search Report and Written Opinion dated Feb. 20, 2015 in related PCT application No. PCT/US2014/065832 (14 pages).
A. Starikovskiy and N. Aleksandrov, "Plasma-assisted ignition and combustion," Progress in Energy and Combustion Science, 39, Feb. 1, 2013, pp. 61-110.
Gaudet, J., et al, "Research Issues in Developing Compact Pulsed Power for High Peak Power Applications on Mobile Platforms," Proc. IEEE, 92, Jun. 7, 2004, pp. 1144-1165.
D.A. Singleton et al. "Compact Pulsed-Power System for Transient Plasma Ignition," IEEE Trans. Plasma Sci., 37, Aug. 12, 2009 pp. 2275-2279.
Wang, F., "Compact High Repetition Rate Pseudospark Pulse Generator," IEEE Trans. Plasma Sci., 33, Aug. 4, 2005 p. 1177-1181.
Singleton, D. R., "Low Energy Compact Power Modulators for Transient Plasma Ignition," IEEE Trans. Dielectr. Electr. nsul., 18, Aug. 4, 2011, pp. 1084-1090.
Rao, X., et al., "Combustion Dynamics of Plasma-Enhansed Premixed and Nonpremixed Flames," IEEE Trans. Plasma Sci., 38, Nov. 12, 2010 pp. 3265-3271.
Pokryvailo, A., et al, "A 1KW Pulsed Corona System for Pollution Control Applications." 14th IEEE International Pulsed Dower Conference, Dallas, TX, USA, Jun. 15-18, 2003.
Pokryvailo, A., et al, "High-Power Pulsed Corona for Treatment of Pollutants in Heterogeneous Media," IEEE Trans. Plasma Sci., 34, Oct. 5, 2006, pp. 1731-1743.
Dammertz, G., et al, "Development of Multimegawatt Gyrotrons for Fusion Plasma Heating and Current Drive," IEEE rans. Elec. Devices., 52, Apr. 5, 2005, pp. 808-817.
Zhu, Z., et al, "High Voltage pulser with a fast fall-time for plasma immersion ion implantation," Review Sci Inst., 82, J45102,Apr. 2011.
Sanders, J., et al, "Scalable, Compact, Nanosecond Pulse Generation with a High Repetition Rate for Biomedical Applications Requiring Intense Electric Fields," Pulsed Power Conference, 2009. PPC '09. IEEE, Washington, DC, Jun. 28-Jul. 2, 2009.
Schamiloglu, E., et al, "Scanning the Technology: Modem Pulsed Power: Charlie Martin and Beyond," Proc. IEEE, 92, Jun. 7, 2004, pp. 1014-1020.
Garwin, Richard, "Pulsed Power Peer Review Committee Report," Sandia National Laboratories Report, SAND2000-2515, Oct. 2000.
U.S. Non-Final Office Action in U.S. Appl. No. 14/542,487 dated Nov. 23, 2015, 11 pages.
International Search Report and Written Opinion dated Oct. 6, 2015 in related PCT application No. PCT/US2015/040204 (15 pages).
U.S. Office Action in U.S. Appl. No. 14/635,991, dated Jul. 29, 2016, 16 pgs.
U.S. Office Action in U.S. Appl. No. 14/635,991, dated Jan. 23, 2017, 21 pgs.
U.S. Notice of Allowance in U.S. Appl. No. 14/635,991, dated May 4, 2017, 7 pgs.
U.S. Office Action in U.S. Appl. No. 16/178,538 dated Jan. 11, 2019, 25 pgs.
U.S. Office Action in U.S. Appl. No. 15/941,731, dated Nov. 16, 2018, 15 pgs.
U.S. Office Action in U.S. Appl. No. 15/623,464, dated Nov. 7, 2017, 17 pgs.
U.S. Office Action in U.S. Appl. No. 15/623,464, dated Mar. 27, 2018, 18 pgs.
U.S. Notice of Allowance in U.S. Appl. No. 15/623,464, dated Oct. 17, 2018, 7 pgs.
U.S. Non-Final Office Action in U.S. Appl. No. 14/798,154 dated Jan. 5, 2016, 13 pages.
U.S. Office Action in U.S. Appl. No. 16/250,765, dated Mar. 29, 2019, 9 pgs.
International Search Report and Written Opinion, as issued in connection with International Patent Application No. DCT/US2019/43933, dated Oct. 25, 2019, 9 pgs.
U.S. Office Action in U.S. Appl. No. 16/250,157, dated Dec. 19, 2019, 5 pgs.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report dated Jul. 28, 2017 in related foreign application No. 14861818.4, 12 Pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Non-Final Office Action in U.S. Appl. No. 15/921,650 dated Nov. 28, 2018, 11 pages.
U.S. Notice of Allowance in U.S. Appl. No. 15/921,650 dated Apr. 4, 2019, 7 pages.
U.S. Non Final Office Action in U.S. Appl. No. 16/178,565, dated Apr. 4, 2019, 10 pages.
U.S. Final Office Action in U.S. Appl. No. 16/178,565, dated Jul. 12, 2019, 11 pages.
U.S. Notice of Allowance in U.S. Appl. No. 16/178,565, dated Nov. 14, 2019, 5 pages.
International Search Report and Written Opinion as issued in connection with International Patent Application No. PCT/US2019/043932, dated Dec. 5, 2019, 16 pages.
U.S. Notice of Allowance in U.S. Appl. No. 16/250,157 dated Apr. 13, 2020, 8 pages.
U.S. Notice of Allowance in U.S. Appl. No. 14/798,154 dated Jun. 1, 2018, 05 pages.
International Search Report and Written Opinion dated Jul. 14, 2015 in related PCT application No. PCT/US15/18349 (11 pages).
Pustylnik, M., et al., "High-voltage nanosecond pulses in a low-pressure radiofrequency discharge", Physical Review E, vol. 87, No. 6, pp. 1-9 (2013).
International Search Report and Written Opinion as issued in connection with International Patent Application No. PCT/US2019/043988, dated Dec. 10, 2019, 13 pages.
International Search Report and Written Opinion as issued in connection with International Patent Application No. PCT/US2019/046067, dated Jan. 3, 2020,13 pages.
International Search Report and Written Opinion as issued in connection with International Patent Application No. PCT/US2020/012641, dated May 28, 2020, 15 pages.
U.S. Non Final Office Action in U.S. Appl. No. 16/537,513, dated Sep. 3, 2020, 13 pages.
International Search Report and Written Opinion as issued in connection with International Patent Application No. PCT/US2020/040579, dated Sep. 30, 2020, 10 pages.
U.S. Notice of Allowance in U.S. Appl. No. 16/523,840, dated Sep. 30, 2020,11 pages.
International Search Report and Written Opinion as issued in connection with International Patent Application No. PCT/US2020/034427, dated Oct. 16, 2020, 9 pages.
International Search Report and written opinion received for PCT Patent Application No. PCT/US2020/60799, dated Feb. 5, 2021, 11 pages.

\* cited by examiner

NANOSECOND PULSER ADC SYSTEM

CROSS-REFERENCE TO RELATED APPLICATIONS

This application claims priority to U.S. Provisional Patent Application No. 62/711,464 filed Jul. 27, 2018, titled "NANOSECOND PULSER SYSTEM," which is incorporated by reference in its entirety.

This application claims priority to U.S. Provisional Patent Application No. 62/711,334 filed Jul. 27, 2018, titled "NANOSECOND PULSER THERMAL MANAGEMENT," which is incorporated by reference in its entirety.

This application claims priority to U.S. Provisional Patent Application No. 62/711,457 filed Jul. 27, 2018, titled "NANOSECOND PULSER PULSE GENERATION," which is incorporated by reference in its entirety.

This application claims priority to U.S. Provisional Patent Application No. 62/711,347 filed Jul. 27, 2018, titled "NANOSECOND PULSER ADC SYSTEM," which is incorporated by reference in its entirety.

This application claims priority to U.S. Provisional Patent Application No. 62/711,467 filed Jul. 27, 2018, titled "EDGE RING POWER SYSTEM," which is incorporated by reference in its entirety.

This application claims priority to U.S. Provisional Patent Application No. 62/711,406 filed Jul. 27, 2018, titled "NANOSECOND PULSER BIAS COMPENSATION," which is incorporated by reference in its entirety.

This application claims priority to U.S. Provisional Patent Application No. 62/711,468 filed Jul. 27, 2018, titled "NANOSECOND PULSER CONTROL MODULE," which is incorporated by reference in its entirety.

This application claims priority to U.S. Provisional Patent Application No. 62/711,523 filed Aug. 10, 2018, titled "PLASMA SHEATH CONTROL FOR RF PLASMA REACTORS," which is incorporated by reference in its entirety.

This application claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," which is incorporated by reference in its entirety.

This application claims priority to U.S. Provisional Patent Application No. 62/789,526 filed Jan. 1, 2019, titled "EFFICIENT ENERGY RECOVERY IN A NANOSECOND PULSER CIRCUIT," which is incorporated by reference in its entirety.

This application claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma.

SUMMARY

Some embodiments include a nanosecond pulser comprising: a plurality of switches; one or more transformers; an output configured to output high voltage waveforms with a amplitude greater than 2 kV and a frequency greater than 1 kHz; and an ADC control module that sensors the output waveform.

A nanosecond pulser system is disclosed. In some embodiments, the nanosecond pulser system may include a nanosecond pulser, a pulser output, and a control system. In some embodiments, the nanosecond pulser comprises: a pulser input; a high voltage DC power supply; one or more solid-state switches coupled with the high voltage DC power supply and the pulser input, the one or more solid-state switches switching the high voltage DC power supply based on input pulses provided by the pulser input; one or more transformers coupled with the one or more switches; and a pulser output coupled with the one or more transformers that outputs a high voltage waveform with an amplitude greater than about 2 kV and a pulse repetition frequency greater than about 1 kHz based on the pulser input. In some embodiments, the control system may be coupled with the nanosecond pulser at a measurement point, the control system providing the input pulses to the pulser input.

In some embodiments, the measurement point comprises a point between the transformer and the pulser output.

In some embodiments, the nanosecond pulser system further comprises an electrode coupled with the pulser output; and the measurement point is at the electrode.

In some embodiments, the control system measures the voltage at the measurement point, and adjusts the voltage, pulse repetition frequency, or duty cycle of the input pulses based on the measured voltage.

In some embodiments, the control system measures the pulse repetition frequency at the measurement point, and adjusts the pulse repetition frequency of the input pulses based on the measured pulsed repetition frequency.

In some embodiments, the input pulses include a first burst comprising a first plurality of low voltage pulses, each of the first plurality of low voltage pulses having a first pulse width; the input pulses include a second burst comprising a second plurality of low voltage pulses each of the second plurality of low voltage pulses having a second pulse width; and the second pulse width is greater than the first pulse width.

In some embodiments, the control system receives input data specifying a voltage and a pulse repetition frequency corresponding to an desired high voltage waveform; compares an output pulser waveform measured at the measurement point with the desired high voltage waveform; and determines adjustments to the pulser input to produce the desired high voltage waveform.

In some embodiments, the control system includes a voltage divider that reduces the high voltage waveform by a factor of 1000.

In some embodiments, the control system includes an analog to digital converter that converts the measured high voltage waveform into a digital signal.

In some embodiments, the nano second pulser system includes a metal shielding disposed between the nanosecond pulser and the control system.

In some embodiments, the nanosecond pulser comprises a resistive output stage, and wherein the measurement point is across a resistor in the resistive output stage.

A nanosecond pulser system is disclosed. In some embodiments, the nanosecond pulser system may include a nanosecond pulser, a nanosecond pulser having a pulser output that outputs a high voltage waveform that includes a plurality of bursts where each burst comprises a plurality of pulses with an amplitude greater than 2 kV and a pulse repetition frequency greater than 1 kHz; and a control system that controls a number of characteristics of the high voltage waveform in real-time including the number of pulses in each burst, a pulse repetition frequency, a pulse width, and a pulse voltage.

In some embodiments, the pulser system controls at least one characteristics of the high voltage waveform with a resolution of less than about 1 µs.

In some embodiments, the pulser system controls at the period between pulses with an accuracy less than about 10 µs.

In some embodiments, control system controls the number of characteristics of the high voltage waveform in response to a plasma processing recipe.

In some embodiments, the plasma processing recipe comprises a plurality of stages and each stage is associated with an ion current, a chamber pressure, and a gas mixture.

In some embodiments, the plasma processing recipe corresponds with an electric field or voltage at a wafer surface.

In some embodiments, the high voltage waveform includes a first burst comprising a first plurality of pulses, each of the first plurality of pulses having a first pulse width; the high voltage waveform includes a second burst comprising a second plurality of pulses each of the second plurality of pulses having a second pulse width; and the second pulse width is greater than the first pulse width.

In some embodiments, the nanosecond pulser comprises a transformer and the output that outputs the high voltage waveform; and the control system is coupled with the nanosecond pulser at a point between the transformer and the pulser output.

In some embodiments, the control system comprises a voltage divider and a fast analog to digital converter.

Some embodiments include a nanosecond pulser system comprising a nanosecond pulser having a pulser output that outputs pulses with an amplitude greater than 2 kV and a pulse repetition frequency greater than 1 kHz; a plurality of sensors that measure an environmental characteristic of the nanosecond pulser system and each of the plurality of sensors provide a sensor signal representing a respective environmental characteristic; a sensor that provides an electronic sensor signal representing a physical characteristic of the nanosecond pulser system; and an interlock electrically coupled with the sensor and the nanosecond pulser that stops operation of the nanosecond pulser in the event the electronic sensor signal is above a first threshold.

In some embodiments, the nanosecond pulser system may also include a control module electrically coupled with the sensor that stops operation of the nanosecond pulser in the event the electronic sensor signal is above a second threshold, the second threshold being different than the first threshold.

In some embodiments, the nanosecond pulser system may also include a liquid cooling subsystem. In some embodiments, the sensors comprises a liquid flow sensor disposed within the liquid cooling subsystem; the first threshold comprises a first flow rate; and the second threshold comprises a second flow rate that is greater than the first flow rate.

In some embodiments, the nanosecond pulser system may also include a cooling subsystem. In some embodiments, one of the sensor comprises a temperature sensor disposed within the cooling subsystem; the first threshold comprises a first temperature; and the second threshold comprises a second temperature that is less than the first temperature.

In some embodiments, the nanosecond pulser system may also include a cooling subsystem that includes a liquid coolant; and a temperature sensor that measures the temperature of the liquid coolant.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Some embodiments include a high voltage nanosecond pulser system with an control system. In some embodiments, the control system can monitor and/or measure and/or record waveforms produce by the high voltage nanosecond pulser. In some embodiments, the control system may monitor the output waveforms produced by the high voltage nanosecond pulser system. In some embodiments, the control system may perform waveform digitization and/or waveform processing.

In some embodiments, a high voltage nanosecond pulser system may pulse voltages with amplitudes of about 2 kV to about 40 kV. In some embodiments, a high voltage nanosecond pulser system may switch with frequencies up to about 500 kHz. In some embodiments, a high voltage nanosecond pulser system may provide single pulses of varying pulse widths from about 50 seconds to about 1 nanosecond. In some embodiments, a high voltage nanosecond pulser system may switch at pulse repetition frequencies greater than about 10 kHz. In some embodiments, a high voltage nanosecond pulser system may operate with rise times less than about 20 ns.

Figure 1:
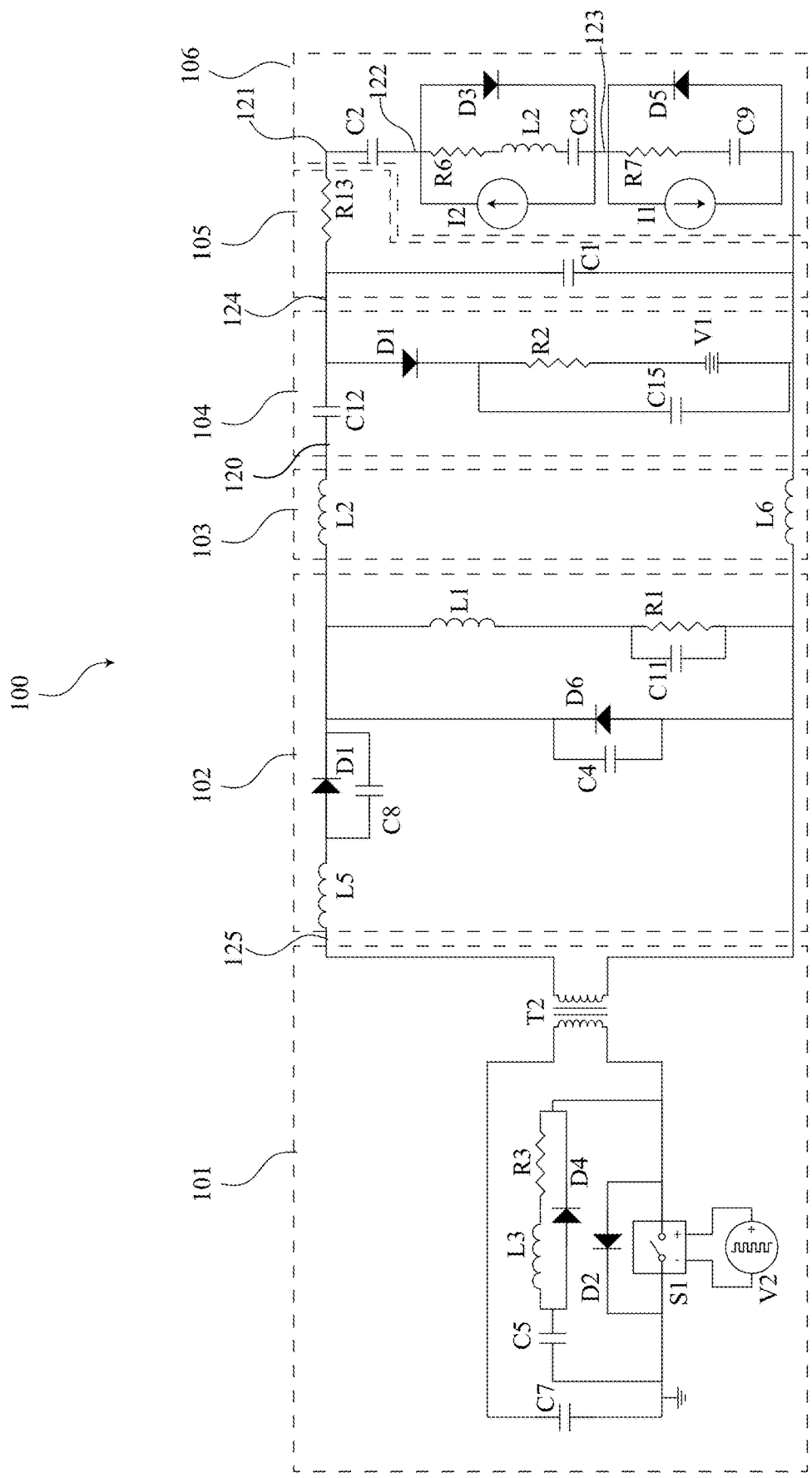
FIG. 1 is a circuit diagram of a nanosecond pulser according to some embodiments.

FIG. 1 is a circuit diagram of a nanosecond pulser system 100 according to some embodiments. The nanosecond pulser system 100 can be implemented within a high voltage nanosecond pulser system. The nanosecond pulser system 100 can be generalized into five stages (these stages could be broken down into other stages or generalized into fewer stages and/or may or may not include the components shown in the figure). The nanosecond pulser system 100 includes a pulser and transformer stage 101, a resistive output stage 102, a lead stage 103, a DC bias compensation circuit 104, and a load stage 106.

In some embodiments, the nanosecond pulser system 100 can produce pulses from the power supply with voltages greater than 2 kV, with rise times less than about 20 ns, and frequencies greater than about 10 kHz.

In some embodiments, the pulser and transformer stage 101 can produce a plurality of high voltage pulses with a high frequency and fast rise times and fall times. In all of the circuits shown, the high voltage pulser may comprise a nanosecond pulser.

In some embodiments, the pulser and transformer stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.), one or more snubber resistors R3, one or more snubber diodes D4, one or more snubber capacitors C5, and/or one or more freewheeling diodes D2. One or more switches and or circuits can be arranged in parallel or series.

In some embodiments, the load stage 106 may represent an effective circuit for a plasma deposition system, plasma etch system, or plasma sputtering system. The capacitance C2 may represent the capacitance of the dielectric material upon which a wafer may sit or capacitance C2 may represent the capacitance between an electrode and a wafer which are separated by a dielectric material. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the plasma sheaths.

In some embodiments, the resistive output stage 102 may include one or more inductive elements represented by inductor L1 and/or inductor L5. The inductor L5, for example, may represent the stray inductance of the leads in the resistive output stage 102. Inductor L1 may be set to minimize the power that flows directly from the pulser and transformer stage 101 into resistor R1.

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 5 nF, 2 nF, 1 nF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 101 can be arranged in parallel and coupled with the resistive output stage 102 across the inductor L1 and/or the resistor R1. Each of the plurality of pulser and transformer stages 101 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias compensation circuit 104 may include a DC voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the pulser and transformer stage 101.

In this example, the DC bias compensation circuit 104 is a passive bias compensation circuit and can include a bias compensation diode D1 and a bias compensation capacitor C15. The bias compensation diode C15 can be arranged in series with offset supply voltage V1. The bias compensation capacitor C15 can be arranged across either or both the offset supply voltage V1 and the resistor R2. The bias compensation capacitor C15 can have a capacitance less than 100 nH to 100 μF such as, for example, about 100 μF, 50 μF, 25 μF, 10 μF, 2μ, 500 nH, 200 nH, etc.

In some embodiments, the bias capacitor C12 may allow for a voltage offset between the output of the pulser and transformer stage 101 (e.g., at the position labeled 125) and the voltage on the electrode (e.g., at the position labeled 124). In operation, the electrode may, for example, be at a DC voltage of −2 kV during a burst, while the output of the nanosecond pulser alternates between +6 kV during pulses and 0 kV between pulses.

In some embodiments, the bias compensation capacitor C15 and the bias compensation diode D1 may allow for the voltage offset between the output of the pulser and transformer stage 101 (e.g., at the position labeled 125) and the voltage on the electrode (e.g., at the position labeled 124) to be established at the beginning of each burst, reaching the needed equilibrium state. For example, charge is transferred from bias capacitor C12 into bias compensation capacitor C15 at the beginning of each burst, over the course of a plurality of pulses (e.g., about 5-100 pulses), establishing the correct voltages in the circuit.

In some embodiments, the DC bias compensation circuit 104 may include one or more high voltage switches placed across the bias compensation diode D1 and coupled with the power supply V1. In some embodiments, a high voltage switch may include a plurality of switches arranged in series to collectively open and close high voltages.

A high voltage switch may be coupled in series with either or both an inductor and a resistor. The inductor may limit peak current through high voltage switch. The inductor, for example, may have an inductance less than about 100 pH such as, for example, about 250 pH, 100 pH, 50 pH, 25 pH, 10 pH, 5 pH, 1 μH, etc. The resistor, for example, may shift power dissipation to the resistive output stage 102. The resistance of resistor may have a resistance of less than about 1,000 ohms, 500 ohms, 250 ohms, 100 ohms, 50 ohms, 10 ohms, etc.

In some embodiments, a high voltage switch may include a snubber circuit.

In some embodiments, the high voltage switch may include a plurality of switches arranged in series to collectively open and close high voltages. For example, the high voltage switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, a high voltage switch may be open while the pulser and transformer stage 101 is pulsing and closed when the pulser and transformer stage 101 is not pulsing. When the high voltage switch is closed, for example, current can short across the bias compensation diode C15. Shorting this current may allow the bias between the wafer and the chuck to be less than 2 kV, which may be within acceptable tolerances.

In some embodiments, the pulser and transformer stage 101 can produce pulses having a high pulse voltage (e.g., voltages greater than 1 kV, 10 kV, 20 kV, 50 kV, 100 kV, etc.), high pulse repetition frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

In some embodiments, the various stages or components shown in FIG. 1 are optional. For example, the resistive output stage 102 may be removed or replaced.

Figure 2:
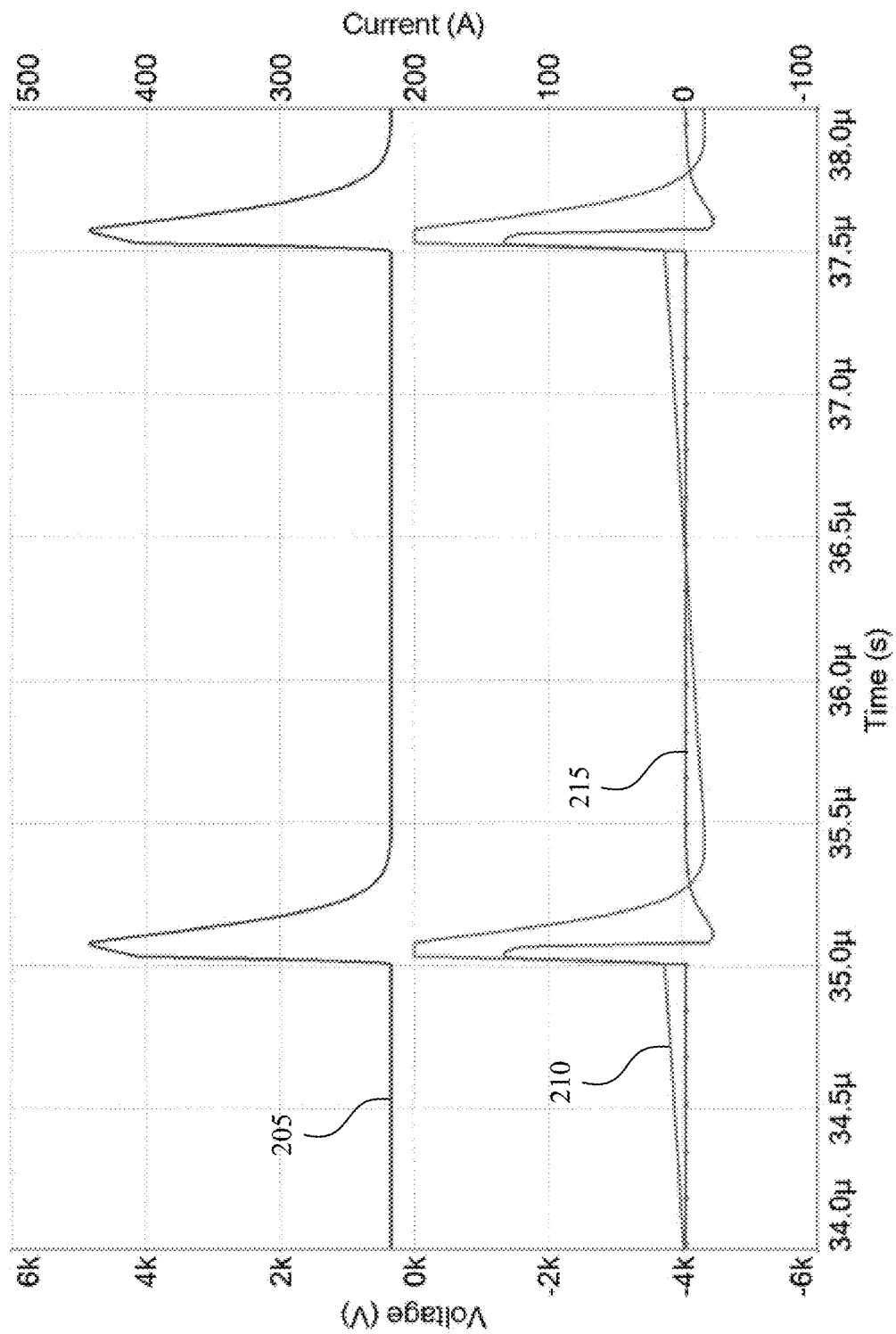
FIG. 2 shows example waveforms produced by the nanosecond pulser.

FIG. 2 shows example waveforms produced by the nanosecond pulser system 100. In these example waveforms, the pulse waveform 205 may represent the voltage provided by the pulser and transformer stage 101. As shown, the pulse waveform 205 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at the surface of a wafer represented in the circuit shown in FIG. 1 by the point between capacitor C2 and capacitor C3 or the voltage across capacitor C3. The pulse waveform 215 represent the current flowing from the pulser and transformer stage 101 to the plasma. The nanosecond pulser system 100 may or may not include either or both diodes D1 or D2.

During the transient state (e.g., during an initial number of pulses not shown in the figure), the high voltage pulses from the pulser and transformer stage 101 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 2.

In steady state and when the switch S1 is open, the capacitor C2 is charged and slowly dissipates through the resistive output stage 102, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser and transformer stage 101. For the example waveform shown in FIG. 2, the voltage of each pulse is about 4 kV; and the steady state voltage at the wafer is about −4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in the pulse waveform 205) as the capacitor C2 is charged. In addition, the voltage at the point between capacitor C2 and capacitor C3 (e.g., at the surface of the wafer) changes to about zero as the capacitor C2 charges, as shown in waveform 210. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 102, that may rapidly discharge the stray capacitance C1, and may allow the voltage at the point between capacitor C2 and capacitor C3 to rapidly return to its steady negative value of about −4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the nanosecond pulser system 100.

Figure 3:
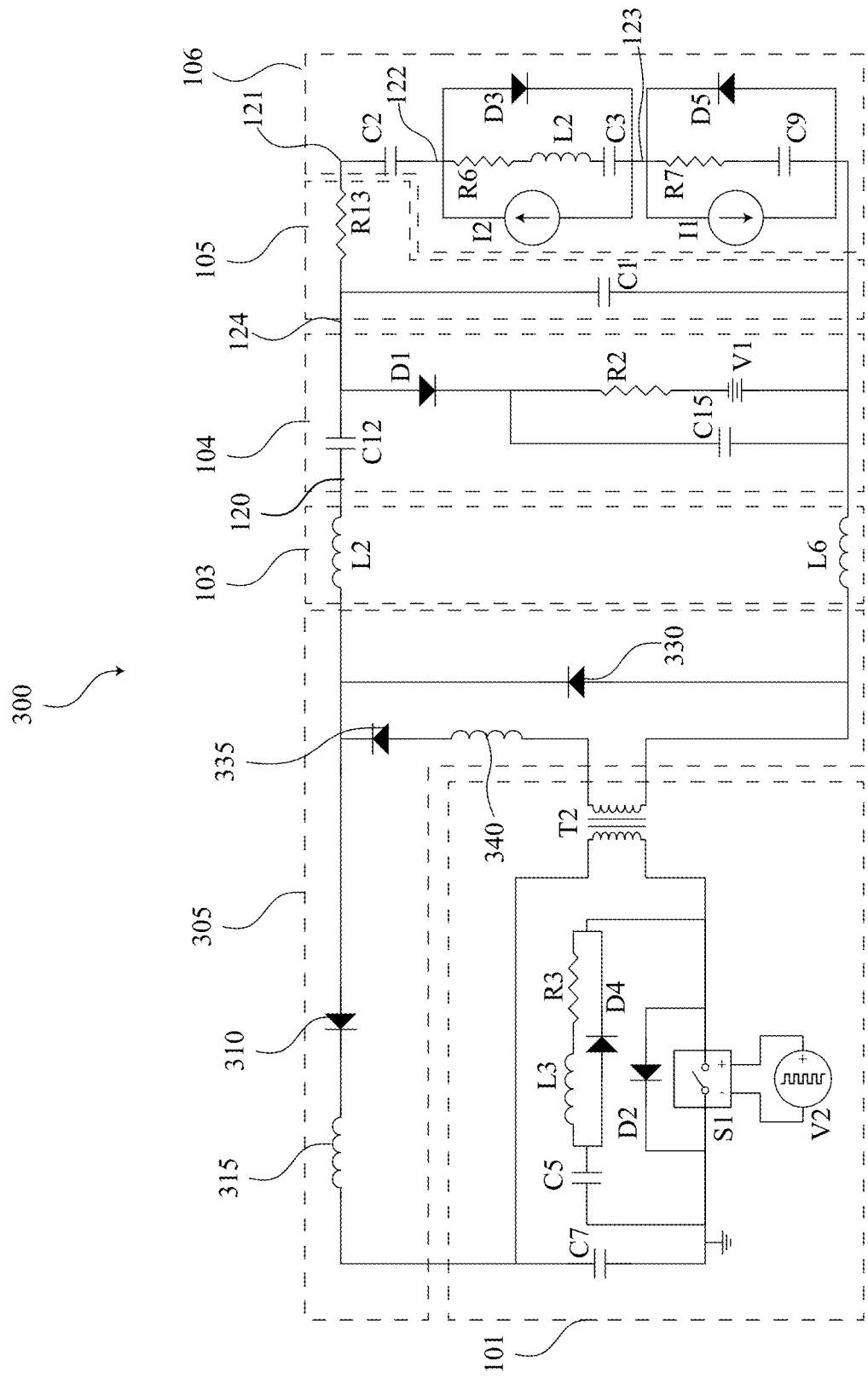
FIG. 3 is a circuit diagram of a nanosecond pulser system with a pulser and transformer stage and an energy recovery circuit according to some embodiments.

FIG. 3 is a circuit diagram of a nanosecond pulser system 300 with the pulser and transformer stage 101 and an energy recovery circuit 305 according to some embodiments. The energy recovery circuit, for example, may replace the resistive output stage 102 shown in FIG. 1. In this example, the energy recovery circuit 305 may be positioned on or electrically coupled with the secondary side of the transformer T1. The energy recovery circuit 305, for example, may include a diode 330 (e.g., a crowbar diode) across the secondary side of the transformer T1. The energy recovery circuit 305, for example, may include diode 310 and inductor 315 (arranged in series), which can allow current to flow from the secondary side of the transformer T1 to charge the power supply C7. The diode 310 and the inductor 315 may be electrically connected with the secondary side of the transformer T1 and the power supply C7. In some embodiments, the energy recovery circuit 305 may include diode 335 and/or inductor 340 electrically coupled with the secondary of the transformer T1. The inductor 340 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 315 when the voltage on the secondary side of the transformer T1 rises above the charge voltage on the power supply C7. When the nanosecond pulser is turned off, current may flow from the capacitors within the load stage 106 through the inductor 315 to charge the power supply C7 until the voltage across the inductor 315 is zero. The diode 330 may prevent the capacitors within the load stage 106 from ringing with the inductance in the load stage 106 or the bias compensation circuit 104.

The diode 310 may, for example, prevent charge from flowing from the power supply C7 to the capacitors within the load stage 106.

The value of inductor 315 can be selected to control the current fall time. In some embodiments, the inductor 315 can have an inductance value between 1 µH-500 µH.

In some embodiments, the energy recovery circuit 305 may include an energy recovery switch that can be used to control the flow of current through the inductor 315. The energy recovery switch, for example, may be placed in series with the inductor 315. In some embodiments, the energy recovery switch may be closed when the switch S1 is open and/or no longer pulsing to allow current to flow from the load stage 106 back to the high voltage load C7.

In some embodiments, the energy recovery switch may include a plurality of switches arranged in series to collectively open and close high voltages. For example, the energy recovery switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the nanosecond pulser system 300 may produce similar waveforms as those shown in FIG. 2.

Figure 4:
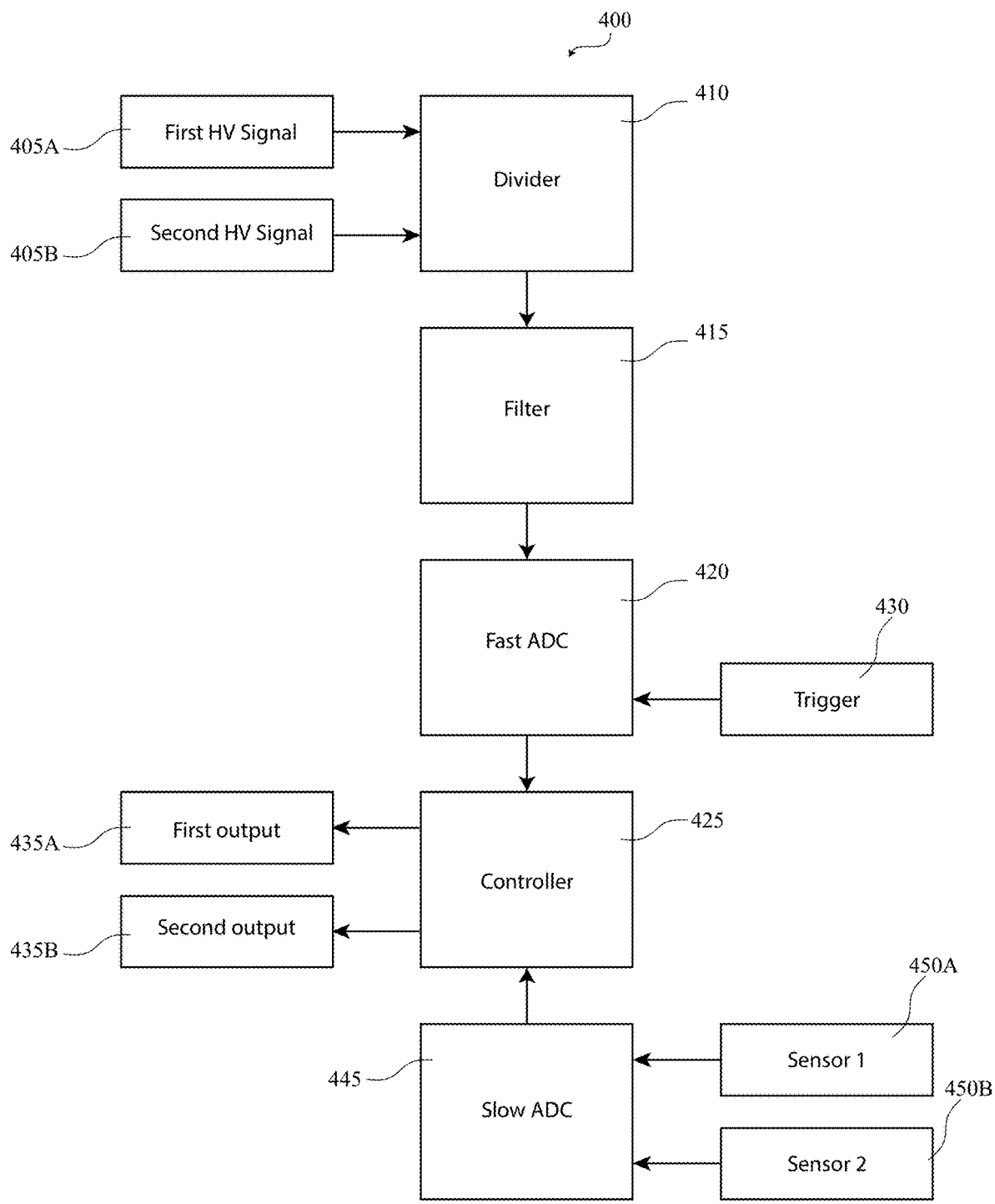
FIG. 4 is a block diagram of an control system for a nanosecond pulser according to some embodiments.

FIG. 4 is a block diagram of an control system 400 for a nanosecond pulser system 100 (or nanosecond pulser system 300) according to some embodiments. In some embodiments, the control system 400 may be electrically coupled with the nanosecond pulser system 100 at one or more locations. For example, a first HV signal 405A (or a second HV signal 405B) may include the voltage signal at point 120 of the nanosecond pulser system 100, which is between the pulser and transformer stage 101 and the bias compensation circuit 104. As another example, a first HV signal 405A (or a second HV signal 405B) may include the voltage signal at point 124 of the nanosecond pulser system 100, which is between the load stage 106 and the bias compensation circuit 104. As another example, a first HV signal 405A (or a second HV signal 405B) may include the voltage signal at point 125 of the nanosecond pulser system 100, which is prior to the resistive output stage 102. As another example, a first HV signal 405A (or a second HV signal 405B) may include the voltage on the wafer, chuck, or electrode. While two signals are shown, any number of signals may be received. As another example, a first HV signal 405A (or a second HV signal 405B) may include the voltage across the resistor R1 in resistive output stage 102, which may be representative of the ion current in the chamber. As another example, a first HV signal 405A (or a second HV signal 405B) may include the voltage in the energy recovery stage, such as, for example, the voltage across inductor 315, which may be representative of the ion current in the chamber.

In some embodiments, the first HV signal 405A and the second HV signal 405B may include the voltage signals on each side of the capacitor C12 of the bias compensation circuit 104. Any number of other signals may be received.

In some embodiments, the first HV signal 405A or the second HV signal 405B may include the voltage signals provided to the load stage 106. In some embodiments, the first HV signal 405A or the second HV signal 405B may include the voltage signals provided to the bias compensation circuit 104. In some embodiments, the first HV signal 405A or the second HV signal 405B may include the voltage signals provided to the lead stage 103. In some embodiments, the first HV signal 405A or the second HV signal 405B may include the voltage signals provided to the pulser and transformer stage 101 may be measured. In some embodiments, the first HV signal 405A or the second HV signal 405B may include the voltage signals provided to the resistive output stage 102.

The first HV signal 405A and the second HV signal 405B collectively or individually may be referred to as the HV input signal 405.

In some embodiments, the HV input signal 405 may divided at voltage divider 410. The voltage divider 410, for example, may include high value resistors or low value capacitors to divide the high voltage HV input signal (e.g., greater than 1 KV) to a low voltage signal (e.g., less than 50 V). The voltage divider 410, for example, may divide the voltage with a 500:1 ratio, 1,000:1 ratio, a 10,000:1 ratio, a 100,000:1 ratio, etc. The voltage divider 410, for example, may divide the HV input signal 405 voltage of 0-10 kV to a voltage of 0-20 V. The voltage divider 410, for example, may divide the voltage with minimal power loss such as, for example, less than about 5 W of power loss.

In some embodiments, the voltage divider 410 may include a low value capacitor, a large value capacitor, a low value resistor, and a large value resistor. The low value capacitor, for example, may comprise a capacitor that has a capacitance value of about 0.1 pF, 0.5 pF, 1.0 pF, 2.5 pF, 5.0 pF, 10.0 pF, 100 pF, 1 nF, 10 nF, etc. The large value capacitor, for example, may comprise a capacitor that has a capacitance value of about 500 pf. In some embodiments, the large value capacitor may have a capacitance value that is about 50, 100, 250, 500, 1,000, 2,500, 5,000 pF, etc. greater than the capacitance value of the low value capacitor.

The low value resistor may have a resistance value of about 1.0 k$\Omega$, 2.5 k$\Omega$, 5.0 k$\Omega$, 10 k$\Omega$, 25 k$\Omega$, 50 k$\Omega$, 100 k$\Omega$, etc. The large value resistor may have a resistance value of about 0.5 M$\Omega$, 1.0 M$\Omega$, 2.5 M$\Omega$, 5.0 M$\Omega$, 10 M$\Omega$, 25 M$\Omega$, 50 M$\Omega$, 100 M$\Omega$, etc. In some embodiments, the large value resistor may have a resistance value that is about 50$\Omega$, 100$\Omega$, 250$\Omega$, 500$\Omega$, 1,000$\Omega$, 2,500$\Omega$, 5,000$\Omega$, etc. greater than the resistance value of the low value resistor. In some embodiments, the ratio of the low value capacitor to the large value capacitor may be substantially the same as the ratio of the low value resistor to the large value resistor.

In some embodiments, the voltage divider 410 may receive the HV input signal and output a divided voltage signal. The divided voltage signal, for example, may be 100, 250, 500, 750, 1,000, etc. times smaller than the HV input signal.

In some embodiments, a filter 415 may be included such as, for example, to filter out any noise from the divided voltage signal. The filter, for example, may include any type of low pass filter, a band pass filter, a band stop filter, or a high pass filter.

In some embodiments, the divided voltage signal may be digitized by the first ADC 420. Any type of analog to digital converter may be used. The first ADC 420 may produce a digitized waveform signal. In some embodiments, the first ADC 420 may capture data at 100, 250, 500, 1,000, 2,000, 5,000 MSPS (megasamples per second or millions of samples per second). In some embodiments, the digitized waveform signal may be communicated to the controller 425 using any type of communication protocol such as, for example, SPI, UART, RS-232, USB, I2C, etc.

In some embodiments, any of the voltage divider 410, the filter 415, or the first ADC 420 may be isolated from the nanosecond pulser system 100 via galvanic isolation or via fiber optic link.

In some embodiments, the controller 425 may comprise any type of controller such as, for example, an FPGA, ASIC, complex programmable logic device, microcontroller, system on a chip (SoC), or any combination thereof. In some embodiments, the controller 425 may include any or all the components of the computational system 600. In some embodiments, the controller 425 may include a standard microcontroller such as, for example, Broadcom Arm Cortex, Intel ARM Cortex, PIC32, etc.

In some embodiments, the controller 425 may receive a trigger signal from trigger 430. In other embodiments, the first ADC 420 may receive the trigger signal from trigger 430. The trigger signal may provide the timing of data acquisition at the first ADC 420. The trigger signal, for example, may be a 5V TTL trigger. The trigger signal, for example, may, have a 50 ohm termination.

The digitized signal may then be output from the controller 425 via one or more output ports such as, for example, a first output 435A or a second output 435B (individually or collectively output 435). These outputs may be coupled with a nanosecond pulser controller. Either or both the output 435 may include an electrical connector such as, for example, an LVDS, TTL, LVTTL connector. Either or both the output 435 may provide data to the nanosecond pulser controller using any type of communication protocol such as, for example, SPI, UART, RS-232, USB, I2C, EtherCat, Ethernet, Profibus, PROFINET.

In some embodiments, the control system 400 may couple with the nanosecond pulser system 100 via a 4 mm Multilam receptacles on the control system 400.

In some embodiments, the control system 400 may include a second ADC 445, which may receive inputs from a first sensor 450A and a second sensor 450B (individually or collectively sensor 450) (or any number of sensors). In some embodiments, the second ADC 445 may digitize analog signals from the sensors 450. The sensors 450 may include, for example, a sensor that senses inlet water temperature, dielectric fluid temperature, dielectric fluid pressure, chassis air temperature, voltage, fluid flow, fluid leak sensor, etc. In some embodiments, the second ADC 445 may include ARM, PIC32, AVR, PSOC, or PIC32.

In some embodiments, the second ADC 445 and the first ADC 420 may comprise a single ADC device. In some embodiments, either or both the second ADC 445 or the first ADC 420 may be part of the controller 425. In some embodiments, the first ADC 420 may operate at a higher acquisition rate than the second ADC.

In some embodiments, the control system may measure the full-width half-max, peak voltage, DC bias, rise time, fall time, etc. of pulses in the nanosecond pulser system 100.

In some embodiments, the control system 400 may monitor the voltage, frequency, pulse width, etc. of pulses and, in response, may adjust the voltage, pulse repetition frequency, pulse width, burst repetition frequency (where a burst includes a plurality of pulses), etc. provided to the input of the nanosecond pulser system 100. For example, the first ADC 420 may monitor the voltage amplitude of a waveform. This voltage data may be provided to the nanosecond pulser controller. The nanosecond pulser controller may adjust the amplitude or frequency of the signal provided to the nanosecond pulser system 100.

In some embodiments, the control system 400 may output arbitrary pulse signals via output 435 to one or more nanosecond pulser systems 100. The output 435, for example, may include either fiber or electric connections. In some embodiments, control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution.

For example, if the pulse voltage is less than a predetermined voltage, the controller 425 may send a signal to the nanosecond pulser system 100 to produce pulses with a higher voltage. If the pulse voltage is greater than a predetermined voltage, the first ADC 420 may send a signal to the nanosecond pulser system 100 to produce pulses with a lower voltage. In some embodiments, the signal to the nanosecond pulser to increase the pulse voltage may comprise a low voltage pulse that has a longer pulse width than the previously sent signal, and the signal to the nanosecond pulser to decrease the pulse voltage may comprise a low voltage pulse that has a shorter pulse width than the previously sent signal.

As another example, if the pulse repetition frequency is greater than an desired pulse repetition frequency, the controller 425 may send a signal to the nanosecond pulser system 100 to produce pulses with a lower frequency. If the burst repetition frequency is less than an desired burst repetition frequency, the controller 425 may send a signal to the nanosecond pulser system 100 to produce pulses with a higher pulse repetition frequency. If the full width half max of the measured pulse is different than an desired burst repetition frequency, the controller 425 may send a signal to the nanosecond pulser system 100 to produce a pulses with an adjusted pulse width or pulse repetition frequency.

As another example, if the waveform pulse width is longer than an desired pulse width, the first ADC 420 may send a signal to the nanosecond pulser system 100 to produce a waveform with a shorter or longer pulse width. If the waveform duty cycle is shorter or longer than an desired duty cycle, the first ADC 420 may send a signal to the nanosecond pulser system 100 to produce a pulses with the appropriate duty cycle.

The control system 400 may monitor other waveform characteristics and/or adjust these other characteristics.

In some embodiments, the control system 400 may output arbitrary pulse signals via output 435 to one or more nanosecond pulser systems 100. For example, the control system may comprise an arbitrary pulse generator. The output 435, for example, may include either fiber or electric connections. In some embodiments, control system 400 can include a plurality of output pulse channels (e.g., 1, 2, 5, 8, 20, 50, 100, etc.) that may, for example, be independent from each other. The plurality of output pulse channels may, for example, output pulses with sub-nanosecond resolution. In some embodiments, the control system 400 may output pulses with resolution less than about 0.1 ns. In some embodiments, the control system 400 may output pulses with jitter less than about 100 ps.

In some embodiments, each output pulse channel of the control system 400 may output pulses to a nanosecond pulser system 100 that triggers the nanosecond pulser system 100. The control system 400 may, for example, adjust parameters of the output pulses in real-time or between pulses. These parameters may include pulse width, pulse repetition frequency, duty cycle, burst repetition frequency, voltage, number of pulses in a burst, the number of burst, etc. In some embodiments, one or more parameters may be adjusted or changed based on input to the control system 400 or based on a recipe or a program.

For example, a recipe may include alternating high bursts and low bursts. A high burst, for example, may include a plurality of high voltage pulses. A low burst, for example, may include a plurality of lower voltage pulses. The high burst and the low burst may, for example, include the same number of pulses or a different number of pulses within each burst. A low burst, for example, may have a voltage that is 10%, 20%, 30%, 40%, 50%, etc. lower than the voltage of the high burst voltage.

The alternating high bursts and low bursts may include 5%, 20%, 50%, 100%, 125%, 150%, etc. ratio of low bursts to high bursts (low-high ratio). For example, a 20% low-high ratio may include a train of 10 bursts, where each burst includes about 500 pulses (or any number of pulses from 1 to 10,000 pulses. In a train of 10 bursts with a 10% low-high ratio, 2 bursts may be low voltage bursts and 8 bursts may be high voltage bursts.

In some embodiments, the controller 425 may communicate pulses with longer low voltage pulses to produce the high bursts and communicate pulses with shorter low voltage pulses to produce the low bursts to the nanosecond pulser to produce alternating high bursts and low bursts as described in U.S. patent application Ser. No. 16/114,195, titled "ARBITRARY WAVEFORM GENERATION USING NANOSECOND PULSES," which is incorporated herein for all purposes.

In some embodiments, the control system 400 comprises an electrical shield. An electrical shield, for example, can separate the high voltage components from the low voltage components. An electrical shield, for example, may be disposed physically between the divider 410 and the controller 425 or the first ADC 420. As another example, the electric shield may be disposed physically between the nanosecond pulser system 100 and the controller 425 or the first ADC 420.

In some embodiments, the electric shield may be disposed physically between resistors in the divider 410. In some embodiments, the electric shield may be disposed physically between capacitors in the divider 410.

In some embodiments, the electrical shield may comprise any type of electrically conductive material or metal such as, for example, copper, nickel, aluminum, bronze, steel, brass, etc. In some embodiments, the electrical shield may comprise sheet metal, metal screen, or metal foam.

In some embodiments, the control system 400 may monitor the sensors 150 and take action. A number of examples are provided below.

In some embodiments, the nanosecond pulser system 100 may include a cooling subsystem. In some embodiments, the cooling subsystem may include a fluid, such as, for example, either water or a dielectric fluid, that flows through the cooling subsystem to remove heat from the nanosecond pulser system 100. For example, one of the sensors 450 may include a flow rate sensor for fluid in the cooling system. If the controller 425 determines the flow rate is below a flow rate threshold, the control system 400 will not allow the nanosecond pulser system 100 to turn on. If the controller 425 determines the flow rate is below a flow rate threshold, the controller 425 may turn off the nanosecond pulser system 100. In some embodiments, the flow rate sensor (in some cases with the controller 425) may be a flow rate interlock. A flow rate interlock, for example, may prevent the nanosecond pulser system 100 from turning on or may turn off the nanosecond pulser system 100, if it is already on, if the flow rate is below the flow rate threshold.

For example, one of the sensors 450 may include a thermometer coupled with the cooling subsystem. If the controller 425 determines the temperature of the cooling subsystem (e.g., the temperature of the fluid) is above a water temperature threshold, the control system 400 will not allow the nanosecond pulser system 100 to turn on. If the controller 425 determines the temperature of the water is above the water temperature threshold, the controller 425 may turn off the nanosecond pulser system 100. A temperature interlock, which is distinct from the controller 425, for example, may prevent the nanosecond pulser system 100 from turning on or may turn off the nanosecond pulser system 100, if it is already on, if the temperature is above the water temperature threshold.

For example, one of the sensors 450 may include a liquid level sensor for a fluid reservoir in a cooling system. If the controller 425 determines the reservoir liquid level is above a liquid level threshold, the control system 400 will not turn on. If the controller 425 determines the reservoir liquid level is above the liquid level threshold, the controller 425 may turn off the nanosecond pulser system 100. A liquid level interlock, which is distinct from the controller 425, for example, may prevent the nanosecond pulser system 100 from turning on or may turn off the nanosecond pulser system 100, if it is already on, if the liquid level is below the liquid level threshold.

In some embodiments, the nanosecond pulser system 100 may include a nitrogen purge subsystem that pumps nitrogen into the nanosecond pulser system. The nitrogen purge system, for example, may introduce dry nitrogen into an enclosure within which the high voltage nanosecond pulser system is disposed. For example, one of the sensors 450 may include a nitrogen pressure sensor. If the controller 425 determines the nitrogen pressure level is below a pressure threshold the control system 400 will not turn on. If the controller 425 determines the nitrogen pressure level is below the pressure threshold the controller 425 may turn off the nanosecond pulser system 100. A pressure interlock, which is distinct from the controller 425, for example, may prevent the nanosecond pulser system 100 from turning on or may turn off the nanosecond pulser system 100, if it is already on, if the pressure is below the pressure threshold.

In some embodiments, one of the sensors 450 may include a DC voltage sensor that may be coupled with a DC power supply in the nanosecond pulser system 100. For example, if multiple DC power supply systems are used in nanosecond pulser system 100 and during operation the voltage varies by more than a set percentage (e.g., 1%, 5%, 10%, 20%, etc.) or more than an absolute voltage (e.g., 5V, 10V, 50V, 100V, etc.) then the controller 425 may turn off the nanosecond pulser system 100. As another example, if power supply systems are used and during operation the voltage output differs by more than a percentage from a set voltage (e.g., 1%, 5%, 10%, 20%, etc.) or more than an absolute voltage from the set voltage (e.g., 5V, 10V, 50V, 100V, etc.) then the controller 425 may turn off pulsing.

In some embodiments, output 435 may include an EtherCat module that may communicate with a third party system (e.g., an external system). In some embodiments, the EtherCat module may comprise any type of communication module. In some embodiments, the EtherCat may include one or more components of the computational system 600.

In some embodiments, the control system 400 may include one or more interlocks coupled with one or more sensors 450. An interlock may, for example, automatically interrupt operation of the nanosecond pulser system 100 without interaction with the controller 425 if the one of the sensor detects a parameter out of tolerance. An interlock signal, for example, may be coupled with a nanosecond pulser system 100 control signal using an AND gate that only allows the control signal to operate the nanosecond pulser if the interlock provides a positive signal.

In some embodiments, a sensor 450 may be coupled with both the controller 425 and an interlock. For example, the interlock may operate at a first threshold level and the controller 425 may operate at a second, different threshold level. The interlock, for example, may operate at a first threshold that protects the nanosecond pulser system from immediate or near-term damage. The controller, for example, may operate at a second threshold that is out of tolerance and the controller may adjust various parameters to bring the system into tolerance, or monitor the system for a period of time before turning off the nanosecond pulser, or may turn off the nanosecond pulser.

For example, a 24V DC interlock may be included may be coupled with a voltage sensor that measures input voltage from a 24V DC power supplier. If the voltage from the 24 V DC power supply exceeds 24V by a predetermined threshold or percentage, then the interlock will send a negative signal to the nanosecond pulser system 100 and the nanosecond pulser system 100 will not operate.

As another example, a high voltage DC interlock may be included may be coupled with a voltage sensor that measures input voltage from a high voltage DC power supplier. If the voltage from the high voltage DC power supply exceeds the expected voltage by a predetermined threshold or percentage, then the interlock will send a negative signal to the nanosecond pulser system 100 and the nanosecond pulser system 100 will not operate.

As another example, a dry N2 pressure interlock may be coupled with a pressure sensor coupled with a nitrogen purge subsystem. If the pressure from the nitrogen purge subsystem exceeds a predetermined threshold or percentage, then the interlock will send a negative signal to the nanosecond pulser system 100 and the nanosecond pulser system 100 will not operate.

As another example, a water flow interlock may be coupled with a water line in the thermal management system. If the flow rate of the water exceeds a predetermined threshold or percentage, then the interlock will send a negative signal to the nanosecond pulser system 100 and the nanosecond pulser system 100 will not operate.

As another example, a dielectric fluid flow interlock may be coupled with a dielectric fluid line in the thermal management system. If the flow rate of the dielectric fluid exceeds a predetermined threshold or percentage, then the interlock will send a negative signal to the nanosecond pulser system 100 and the nanosecond pulser system 100 will not operate.

As another example, a reservoir level interlock may be coupled with a water or dielectric fluid reservoir in the thermal management system. If the reservoir level exceeds a predetermined threshold or percentage, then the interlock will send a negative signal to the nanosecond pulser system 100 and the nanosecond pulser system 100 will not operate.

As another example, a water temperature interlock may be coupled with a thermometer in the thermal management system. If the temperature of the water exceeds a predetermined threshold or percentage, then the interlock will send a negative signal to the nanosecond pulser system 100 and the nanosecond pulser system 100 will not operate.

As another example, a dielectric fluid temperature interlock may be coupled with a thermometer in the thermal management system. If the temperature of the dielectric fluid exceeds a predetermined threshold or percentage, then the interlock will send a negative signal to the nanosecond pulser system 100 and the nanosecond pulser system 100 will not operate.

In some embodiments, the control system may control the operation of a pulsing system such as, for example, pulse width, duty cycle, high voltage set point, on/off, returns current output voltage, high voltage current set point, returns current output current, enable high voltage output, returns high voltage enable state, emergency shutdown, etc.

In some embodiments, a user may interface with the control system through an EtherCat module. A user, for example, may issue a PW command to set the output pulse width. As another example, user may issue DUTY command to set the duty cycle. As another example, a user may issue a PWR command to turn the power on and begin operation of unit or off to end operation of the unit. As another example, the unit may continue to operate as set until issued another command to change duty cycle, pulse width, or issued another PWR command to shut off.

In some embodiments, the control system 400 may receive commands from an external source in any type of communication protocols such as, for example, EtherCat, LXI, Ethernet, Profibus, PROFINET, RS-232, ModBus, USB, UART, SPI, CC-Lin, etc.

Figure 5:
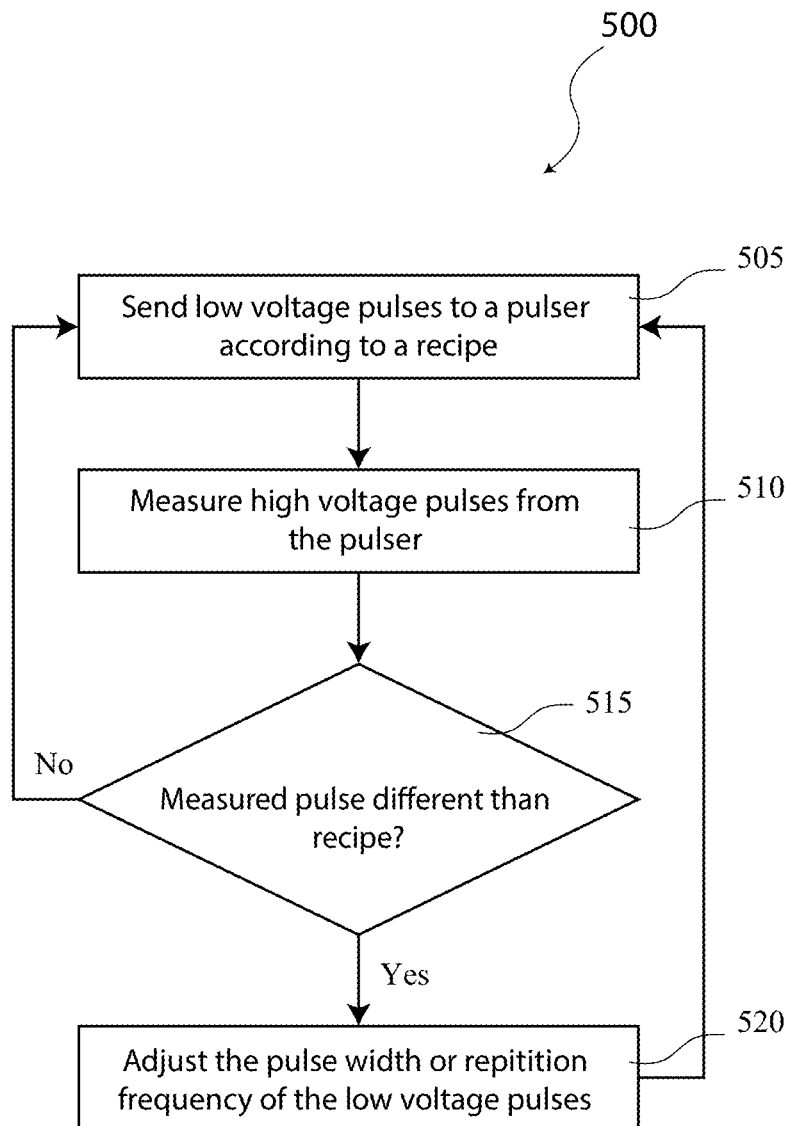
FIG. 5 is a block diagram of a flowchart of process according to some embodiments.

FIG. 5 is a block diagram of a flowchart of process 500 according to some embodiments. Process 500 includes a number of blocks. Any additional blocks may be added or any blocks may be removed. The process 500 may, for example, be executed by one or more components of computational system 600. The process 500 may, for example be executed by the control system 400.

At block 505, the process 500 can send a plurality of low voltage pulses to a high voltage pulser system (e.g., nanosecond pulser 100 or nanosecond pulser 300) based on a recipe. The low voltage pulses, for example, may have a peak voltage of less than 20 V such as, for example, 5V. The low voltage pulses may have a pulse repetition frequency and each pulse may have a pulse width.

In some embodiments, the recipe may include alternating high bursts and low bursts as described above. In some embodiments, the recipe may be adjusted or changed in real time. In some embodiments, the recipe may be dependent on various parameters or characteristics of the plasma chamber.

At block 510, high voltage pulses can be measured at the high voltage pulser. The high voltage pulsers, for example, may have a peak voltage greater than 2 kV. In some embodiments, the high voltage pulses may have a peak voltage that is more then 100 times the peak voltage of the low voltage pulses. In some embodiments, the high voltage pulses may be measured at the electrode within a plasma chamber. In some embodiments, the high voltage pulses may be measured across a resistor within a resistive output stage or an energy recover stage of the high voltage pulser. In some embodiments, the high voltage pulses may be measured at a bias capacitor within the high voltage pulser.

In some embodiments, the full-width half-max, peak voltage, DC bias, rise time, fall time, etc. of the high voltage pulses can be measured.

At block 515, the measure pulses can be compared with the desired (or anticipated) pulses. If the measured pulses are consistent with the desired pulses (e.g., within some tolerance), the process 500 proceeds to block 505 and the process repeats.

If the measured pulses are not consistent with the desired pulses, then process 500 proceeds to block 520. At block 520 the pulse width or the pulse repetition frequency of the low voltage pulses are adjusted. For example, if the voltage of the high voltage pulses is lower than desired, then the pulse width of the low voltage pulses may be increased. As another example, if the voltage of the high voltage pulses is higher than desired, then the pulse width of the low voltage pulses may be decreased.

For example, if the pulse repetition frequency (or the pulse repetition period) of the high voltage pulses is lower than desired, then the pulse repetition frequency of the low voltage pulses may be increased. As another example, if the pulse repetition frequency (or the pulse repetition period) of the high voltage pulses is higher than desired, then the pulse repetition frequency of the low voltage pulses may be decreased.

In some embodiments, the process 500 may be executed in real time. For example, the process 500 may repeat in less than about 20 µs, 10 µs, 5 µs, 1 µs, etc. As another example, the process 500 may control the accuracy of the period between pulses (e.g., the pulse repetition period) with an accuracy less than about 50 µs, 20 µs, 10 µs, 5 µs, 1 µs, etc.

Figure 6:
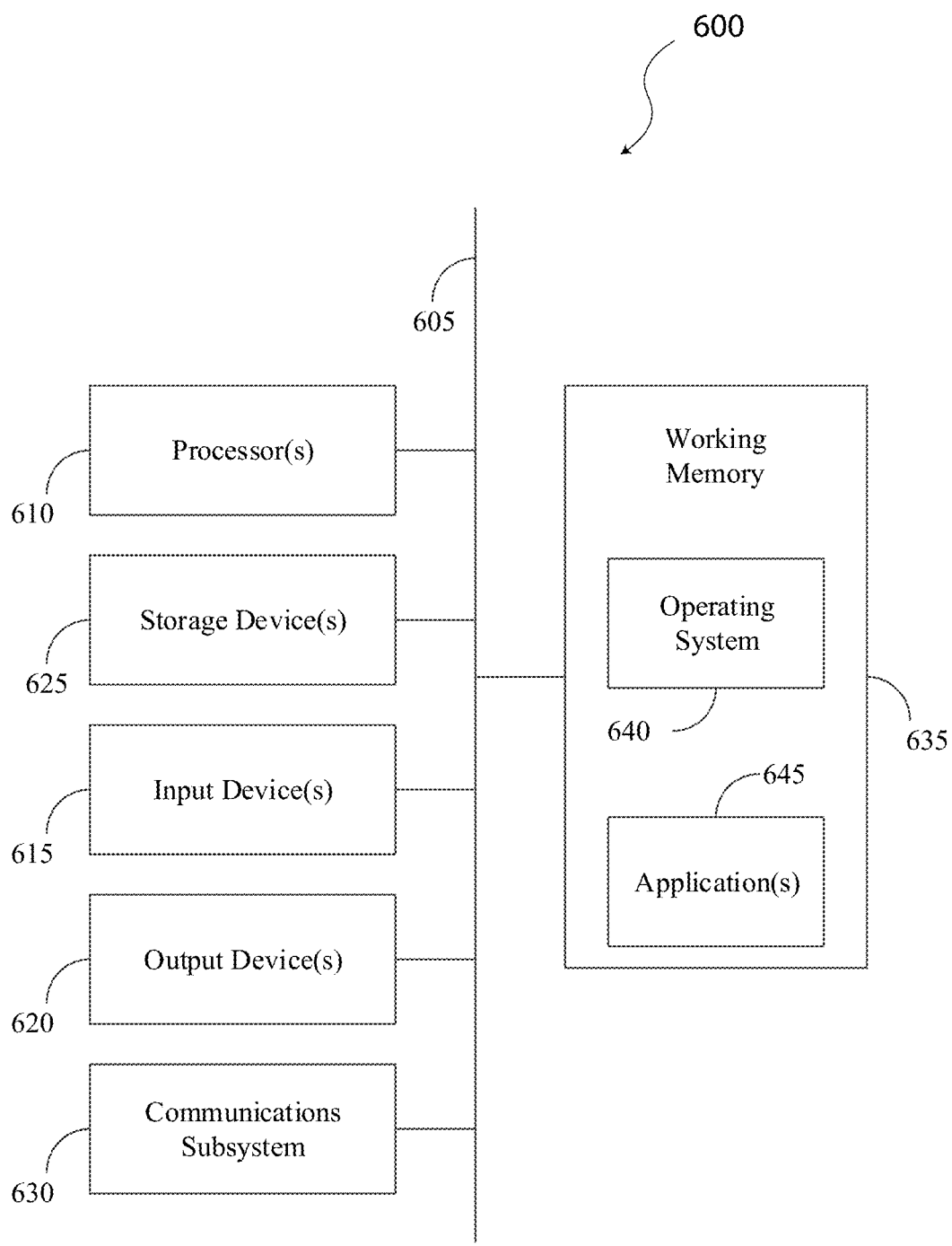
FIG. 6 shows an illustrative computational system for performing functionality to facilitate implementation of embodiments described herein.

In some embodiments, the control system 400 may include a computational system that includes some or all of the components of computational system 600, shown in FIG. 6. As another example, computational system 600 can be used perform any calculation, identification and/or determination described in this document. The computational system 600 may include hardware elements that can be electrically coupled via a bus 605 (or may otherwise be in communication, as appropriate). The hardware elements can include one or more processors 610, including without limitation one or more general-purpose processors and/or one or more special-purpose processors (such as digital signal processing chips, graphics acceleration chips, and/or the like); one or more input devices 615, which can include without limitation a mouse, a keyboard and/or the like; and one or more output devices 620, which can include without limitation a display device, a printer and/or the like.

The computational system 600 may further include (and/or be in communication with) one or more storage devices 625, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 600 might also include a communications subsystem 630, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 630 may permit data to be exchanged with a network (such as the network described below, to name one example), and/or any other devices described herein. In many embodiments, the computational system 600 will further include a working memory 635, which can include a RAM or ROM device, as described above.

The computational system 600 also can include software elements, shown as being currently located within the working memory 635, including an operating system 640 and/or other code, such as one or more application programs 645, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 625 described above.

In some cases, the storage medium might be incorporated within the computational system 600 or in communication with the computational system 600. In other embodiments, the storage medium might be separate from a computational system 600 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 600 and/or might take the form of source and/or installable code, which, upon compilation and/or installation on the computational system 600 (e.g., using any of a variety of generally available compilers, installation programs, compression/decompression utilities, etc.) then takes the form of executable code.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A nanosecond pulser system comprising:
   a nanosecond pulser comprising:
   a pulser input;
   a high voltage DC power supply;
   one or more solid-state switches coupled with the high voltage DC power supply and the pulser input, the one or more solid-state switches switching the high voltage DC power supply based on input pulses provided by the pulser input; and
   a pulser output coupled with the one or more transformers that outputs a high voltage waveform with an amplitude greater than about 2 kV and a pulse repetition frequency greater than about 1 kHz based on the pulser input; and
   a control system coupled with the nanosecond pulser at a measurement point and coupled with the pulser input, the control system providing the input pulses to the pulser input, the control system measures the voltage at the measurement point, and the control system adjusts the voltage, pulse repetition frequency, or duty cycle of the input pulses based on the measured voltage.

2. The nanosecond pulser system according to claim 1, wherein the measurement point comprises a point between the transformer and the pulser output.

3. The nanosecond pulser system according to claim 1, wherein:
   the nanosecond pulser system further comprises an electrode coupled with the pulser output; and
   the measurement point is at the electrode.

4. The nanosecond pulser system according to claim 1, further comprising one or more transformers coupled with the one or more switches.

5. The nanosecond pulser system according to claim 1, wherein the control system measures the pulse repetition frequency at the measurement point, and adjusts the pulse repetition frequency of the input pulses based on the measured pulsed repetition frequency.

6. The nanosecond pulser system according to claim 1,
   wherein the input pulses include a first burst comprising a first plurality of low voltage pulses, each of the first plurality of low voltage pulses having a first pulse width;
   wherein the input pulses include a second burst comprising a second plurality of low voltage pulses each of the second plurality of low voltage pulses having a second pulse width; and
   wherein the second pulse width is greater than the first pulse width.

7. The nanosecond pulser system according to claim 1, wherein the control system:
   receives input data specifying a voltage and a pulse repetition frequency corresponding to an desired high voltage waveform;
   compares an output pulser waveform measured at the measurement point with the desired high voltage waveform; and
   determines adjustments to the pulser input to produce the desired high voltage waveform.

8. The nanosecond pulser system according to claim 1, wherein the control system comprises a voltage divider that reduces the high voltage waveform by a factor of 1000.

9. The nanosecond pulser system according to claim 1, wherein the control system includes an analog to digital converter that converts the measured high voltage waveform into a digital signal.

10. The nanosecond pulser system according to claim 1, further comprising metal shielding disposed between the nanosecond pulser and the control system.

11. The nanosecond pulser system according to claim 1, wherein the nanosecond pulser comprises a resistive output stage, and wherein the measurement point is across a resistor in the resistive output stage.

12. A nanosecond pulser system comprising:
    a nanosecond pulser having a pulser output that outputs a high voltage waveform that includes a plurality of bursts where each burst comprises a plurality of pulses with an amplitude greater than 2 kV and a pulse repetition frequency greater than 1 kHz; and
    a control system that controls a number of characteristics of the high voltage waveform including the number of pulses in each burst, a pulse repetition frequency, a pulse width, and a pulse voltage.

13. The nanosecond pulser system according to claim 12, wherein the control system controls at least one characteristics of the high voltage waveform with a resolution of less than about 1 µs.

14. The nanosecond pulser system according to claim 12, wherein the control system controls at the period between pulses with an accuracy less than about 10 µs.

15. The nanosecond pulser system according to claim 12, wherein the control system controls the number of characteristics of the high voltage waveform in response to a plasma processing recipe.

16. The nanosecond pulser system according to claim 15, wherein the plasma processing recipe comprises a plurality of stages and each stage is associated with an ion current, a chamber pressure, and a gas mixture.

17. The nanosecond pulser system according to claim 12, wherein the control system controls the number of characteristics of the high voltage waveform in real-time.

18. The nanosecond pulser system according to claim 12,
wherein the high voltage waveform includes a first burst comprising a first plurality of pulses, each of the first plurality of pulses having a first pulse width;
wherein the high voltage waveform includes a second burst comprising a second plurality of pulses each of the second plurality of pulses having a second pulse width; and
wherein the second pulse width is greater than the first pulse width.

19. The nanosecond pulser system according to claim 12,
wherein the nanosecond pulser comprises a transformer and the output that outputs the high voltage waveform; and
wherein the control system is coupled with the nanosecond pulser at a point between the transformer and the pulser output.

20. A nanosecond pulser system comprising:
a nanosecond pulser having a pulser output that outputs pulses with an amplitude greater than 2 kV and a pulse repetition frequency greater than 1 kHz;
an electrode in a plasma chamber;
a measurement point located at or near the electrode;
a sensor coupled with the measurement point that provides an electronic sensor signal representing voltage waveforms occurring at the measurement point; and
a control system coupled with the sensor and the nanosecond pulser, the control system controls the pulser output in response to the electronic sensor signal.

21. The nanosecond pulser system according to claim 20,
wherein the voltage waveforms include a first burst comprising a first plurality of pulses, each of the first plurality of pulses having a first pulse width;
wherein the voltage waveforms include a second burst comprising a second plurality of pulses each of the second plurality of pulses having a second pulse width; and
wherein the second pulse width is greater than the first pulse width.

22. The nanosecond pulser system according to claim 20, wherein the control system controls the pulser output in response to a plasma processing recipe.

23. The nanosecond pulser system according to claim 22, wherein the plasma processing recipe comprises a plurality of stages and each stage is associated with an ion current, a chamber pressure, and a gas mixture.

* * * * *